United States Patent
Huang et al.

(10) Patent No.: US 7,666,706 B2
(45) Date of Patent: Feb. 23, 2010

(54) METHOD FOR MAKING A THIN-FILM POLY-CRYSTALLINE SILICON SOLAR CELL ON AN INDIUM TIN OXIDE-GLASS SUBSTRATE AT A LOW TEMPERATURE

(75) Inventors: Yu-Hsiang Huang, Taoyuan County (TW); Shan-Ming Lan, Taoyuan County (TW); Tsun-Neng Yang, Taipei (TW); Chien-Te Ku, Taoyuan County (TW); Meng-Chu Chen, Taichung (TW); Zhen-Yu Li, Chiayi County (TW)

(73) Assignee: Atomic Energy Council, Taoyuan (TW)

( * ) Notice: Subject to any disclaimer, the term of this patent is extended or adjusted under 35 U.S.C. 154(b) by 126 days.

(21) Appl. No.: 11/987,803

(22) Filed: Dec. 4, 2007

(65) Prior Publication Data
US 2009/0142877 A1 Jun. 4, 2009

(51) Int. Cl.
*H01L 21/00* (2006.01)
(52) U.S. Cl. ......................................................... 438/97
(58) Field of Classification Search .................... 438/96, 438/97
See application file for complete search history.

(56) References Cited
U.S. PATENT DOCUMENTS
2008/0264477 A1* 10/2008 Moslehi ........................... 136/255

OTHER PUBLICATIONS

Nast et al., Polycrystalline Silicon Thin Films on Glass by Aluminum-Induced Crystallization, IEEE Transactions on Electron Devices, vol. 46, No. 10, Oct. 1999, pp. 2062-2068.*
Gall et al., Polycrystalline Silicon on Glass by Aluminum-Induced Crystallization IEEE Photovoltaic Specialists Conference, Proceedings of the Twenty-Ninth, 2002, pp. 1202-1205.*
Aberle et al., Polycrystalline Silicon on Glass Thin-film Solar Cell Research at UNSW Using the Seed Layer Concept, 3$^{rd}$ World Conference on Photovoltaic Energy COnversion, May 2003, pp. 1194-1197.*

* cited by examiner

*Primary Examiner*—Evan Pert
(74) *Attorney, Agent, or Firm*—Jackson IPG PLLC

(57) ABSTRACT

A method is disclosed for making a thin-film poly-crystalline silicon solar cell. In the method, there is provided an ITO-glass substrate by coating a glass substrate with a transparent and conductive ITO film. An amorphous silicon film is grown on the ITO-glass substrate. An aluminum film is grown on the amorphous silicon film. The aluminum film and the amorphous silicon film are annealed and therefore converted and interchanged into an aluminum-silicon alloy film and a p$^+$ poly-crystalline silicon film, respectively. In a low-temperature plasma-based deposition process, a p$^-$ poly-crystalline silicon film is coated on the p$^+$ poly-crystalline silicon film, and an n$^+$ poly-crystalline silicon film is coated on the p$^-$ poly-crystalline silicon film. An ohmic contact is provided on the transparent and conductive ITO film. Other ohmic contacts are provided on the n$^+$ poly-crystalline silicon film. An anti-reflection film is coated on the n$^+$ poly-crystalline silicon film.

3 Claims, 7 Drawing Sheets

US 7,666,706 B2

METHOD FOR MAKING A THIN-FILM POLY-CRYSTALLINE SILICON SOLAR CELL ON AN INDIUM TIN OXIDE-GLASS SUBSTRATE AT A LOW TEMPERATURE

BACKGROUND OF INVENTION

1. Field of Invention

The present invention relates to a solar cell and, more particularly, to a method for making a thin-film poly-crystalline silicon solar cell on an indium tin oxide ("ITO")-glass substrate at a low temperature.

2. Related Prior Art

Various materials have been used to make solar cells in various processes in various research institutions around the world. For example, there are solar cells based on Si, GaAs, InP, GaInP, CdTe and $CuInSe_2$. The internal quantum efficiencies of the solar cells are different. The silicon solar cells are the most popular among these solar cells in consideration of the internal quantum efficiencies and costs. The silicon solar cells includes single-crystalline, poly-crystalline and amorphous silicon solar cells. The internal quantum efficiencies of the single-crystalline silicon solar cells are about 24.7%, the poly-crystalline silicon solar cells 19.8%, and the amorphous silicon solar cells 14.5%. The internal quantum efficiencies of the single-crystalline and poly-crystalline silicon solar cells are high, but the prices are also high. The prices of the amorphous silicon solar cells are low, but the internal quantum efficiencies are also low. To reduce the costs, there have been devised thin-film poly-crystalline silicon solar cells.

The internal quantum efficiencies of the thin-film poly-crystalline silicon solar cells made in laboratories can be higher than 30%. However, the internal quantum efficiencies of the thin-film poly-crystalline silicon solar cells on the market are lower than 20%. Referring to FIG. 7, a typical thin-film poly-crystalline silicon solar cell includes a laminate 5 including a substrate 51, a conductive film 52 coated on the substrate 51 and a poly-crystalline silicon film 53 coated on the conductive film 52. However, the grains of the laminate 5 cannot reduce the odds of the electrons and holes hitting the crystal boundaries. Because the limited mobility and diffusion length are limited, the internal quantum efficiency of the conventional thin-film silicon solar cell is low.

The present invention is therefore intended to obviate or at least alleviate the problems encountered in prior art.

SUMMARY OF INVENTION

It is the primary objective of the present invention to provide a method for making an inexpensive and efficient thin-film poly-crystalline silicon solar cell on an ITO-glass substrate at a low temperature.

According to the present invention, the method includes the step of making an ITO-glass substrate by coating a glass substrate with a transparent and conductive ITO film. An amorphous silicon film is grown on the ITO-glass substrate. An aluminum film is grown on the amorphous silicon film. The aluminum film and the amorphous silicon film are annealed and therefore converted and interchanged into an aluminum-silicon alloy film and a $p^+$ poly-crystalline silicon film, respectively In a low-temperature plasma-based deposition process, a $p^-$ poly-crystalline silicon film is coated on the $p^+$ poly-crystalline silicon film, and an $n^+$ poly-crystalline silicon film is coated on the $p^-$ poly-crystalline silicon film. An ohmic contact is provided on the transparent and conductive ITO film. Other ohmic contacts are provided on the $n^+$ poly-crystalline silicon film. An anti-reflection film is coated on the $n^+$ poly-crystalline silicon film.

Other objectives, advantages and features of the present invention will become apparent from the following description referring to the attached drawings.

BRIEF DESCRIPTION OF DRAWINGS

The present invention will be described via the detailed illustration of the preferred embodiment referring to the drawings.

DETAILED DESCRIPTION OF PREFERRED EMBODIMENT

Figure 1:
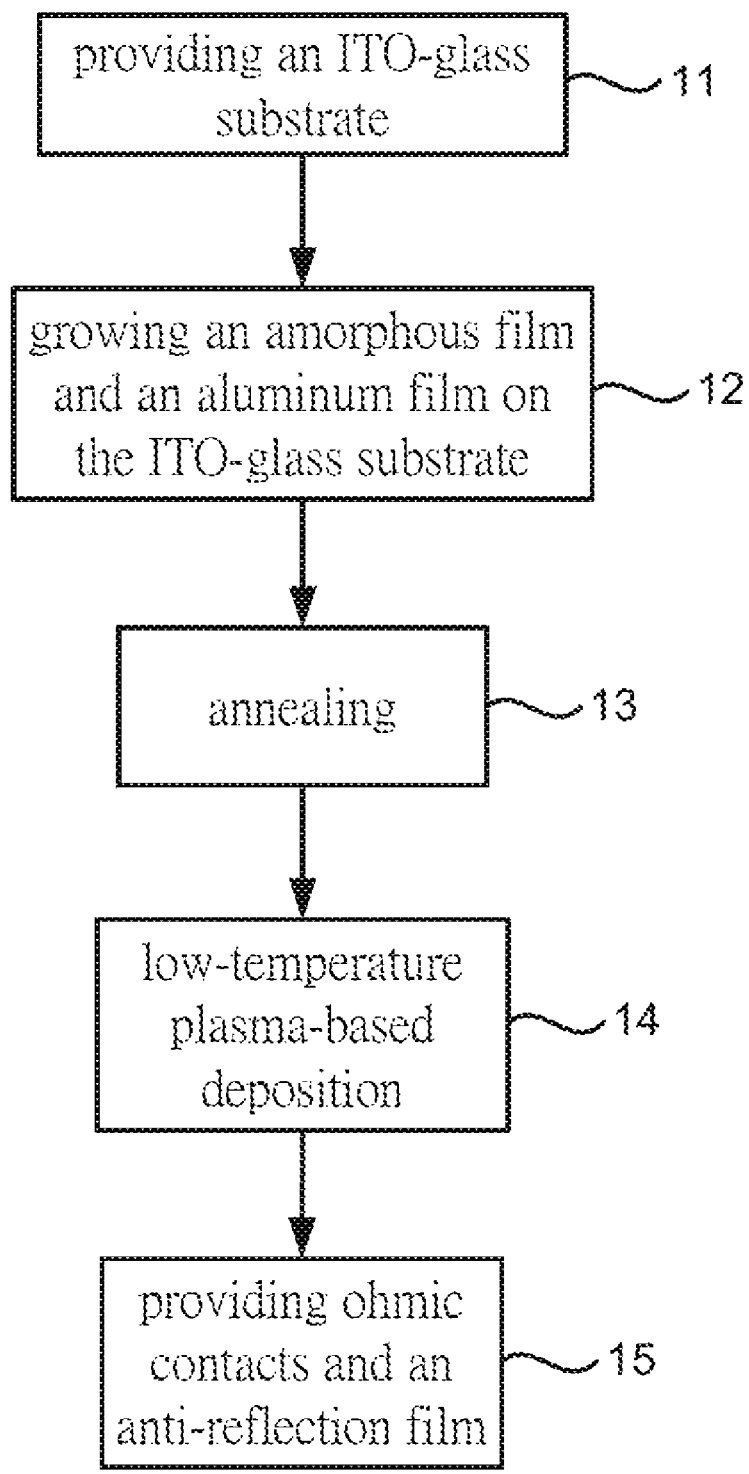
FIG. 1 is a flow chart of a method for making an inexpensive and efficient thin-film poly-crystalline silicon solar cell on an ITO-glass substrate according to the preferred embodiment of the present invention.

Referring to FIG. 1, there is shown a method for making an inexpensive and efficient thin-film poly-crystalline silicon solar cell according to the preferred embodiment of the present invention.

Figure 2:
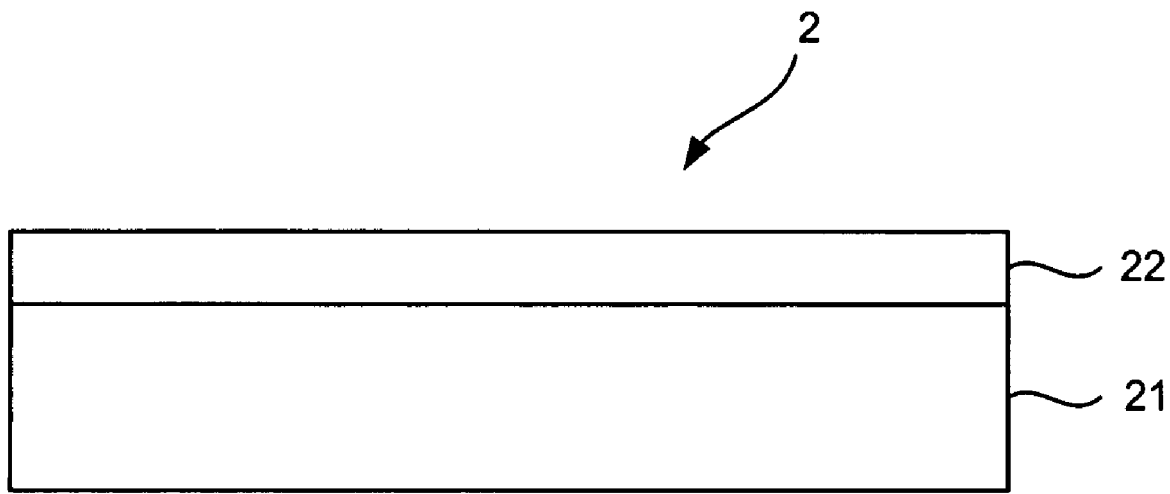
FIG. 2 is a side view of the ITO-glass substrate for use in the method shown in FIG. 1.

Referring to FIGS. 1 and 2, at 11, an ITO-glass substrate 2 is provided. The ITO-glass substrate 2 is provided by coating a glass substrate 21 with a transparent and conductive ITO film 22.

Figure 3:
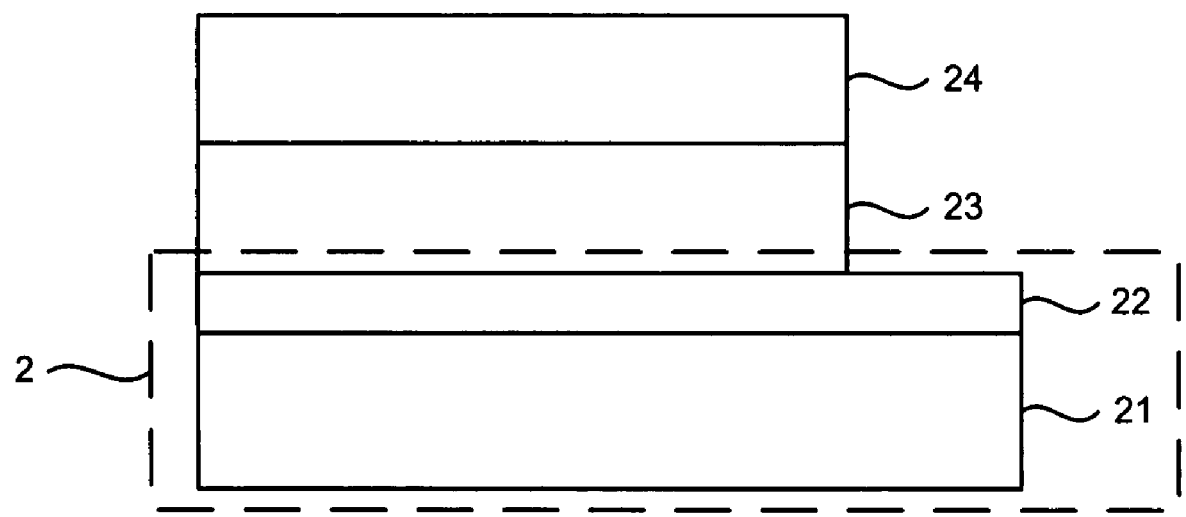
FIG. 3 is a side view of a laminate including an aluminum film, an amorphous silicon film and the ITO-glass substrate shown in FIG. 2.

Referring to FIGS. 1 and 3, at 12, an amorphous silicon film 23 is grown on the ITO-glass substrate 2, and an Aluminum film 24 is grown on the amorphous silicon film 23, thus forming a laminate.

Figure 4:
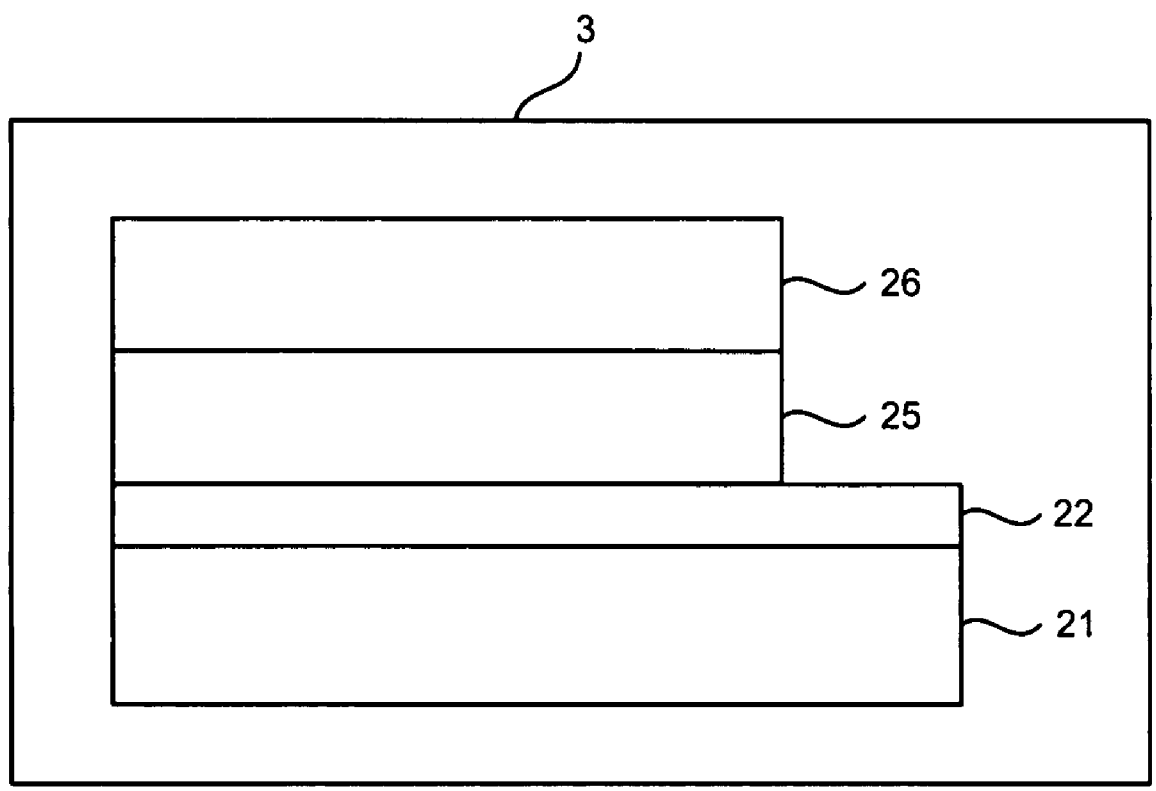
FIG. 4 is a side view of a thermal annealing device for processing the laminate shown in FIG. 3.

Referring to FIGS. 1 and 4, at 13, the laminate is annealed in a thermal annealing device 3 at a temperature lower than the melting point of the glass substrate 21. Thus, some of the silicon molecules of the amorphous silicon film enter the aluminum film 24, thus converting the aluminum film 24 into an aluminum-silicon alloy film 25. At the same time, the amorphous silicon film 23 is converted into a $p^+$ poly-crystalline silicon film 26. As shown in FIG. 4, the relative positions of the original aluminum film 24 and the amorphous silicon film 23 interchange in the formation of the aluminum-silicon alloy film 25 and $p^{30}$ poly-crystalline silicon film 26 through the downward migration of aluminum into the original amorphous silicon film 23.

Figure 5:
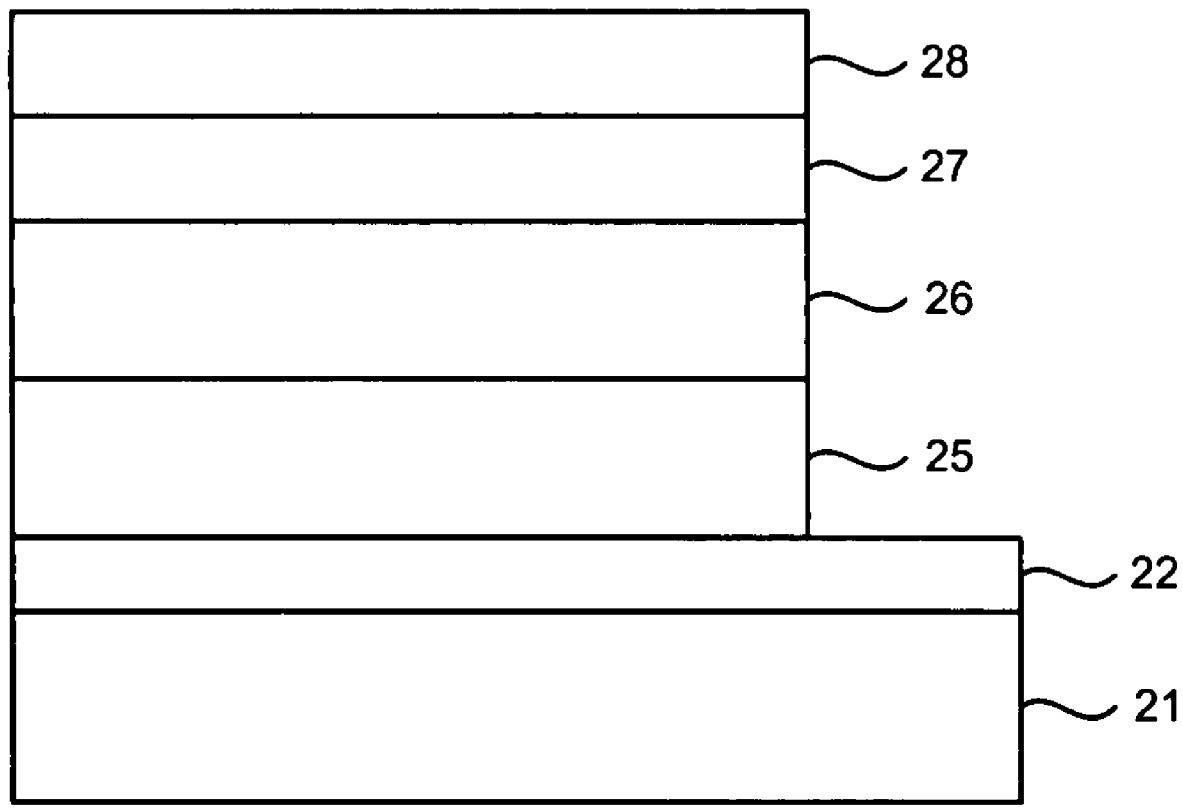
FIG. 5 is a side view of another laminate including an $N^+$ Poly-crystalline silicon film, a $P^-$ Poly-crystalline silicon film and the laminate shown in FIG. 4.

Referring to FIGS. 1 and 5, at 14, in a low-temperature plasma-based deposition process, a $p^-$ poly-crystalline silicon film 27 is coated on the $p^+$ poly-crystalline silicon film 26, and an $n^+$ poly-crystalline silicon film 28 is coated on the $p^-$ poly-crystalline silicon film 27. The low-temperature plasma-based deposition process may be a plasma-enhanced chemical vapor deposition process.

Figure 6:
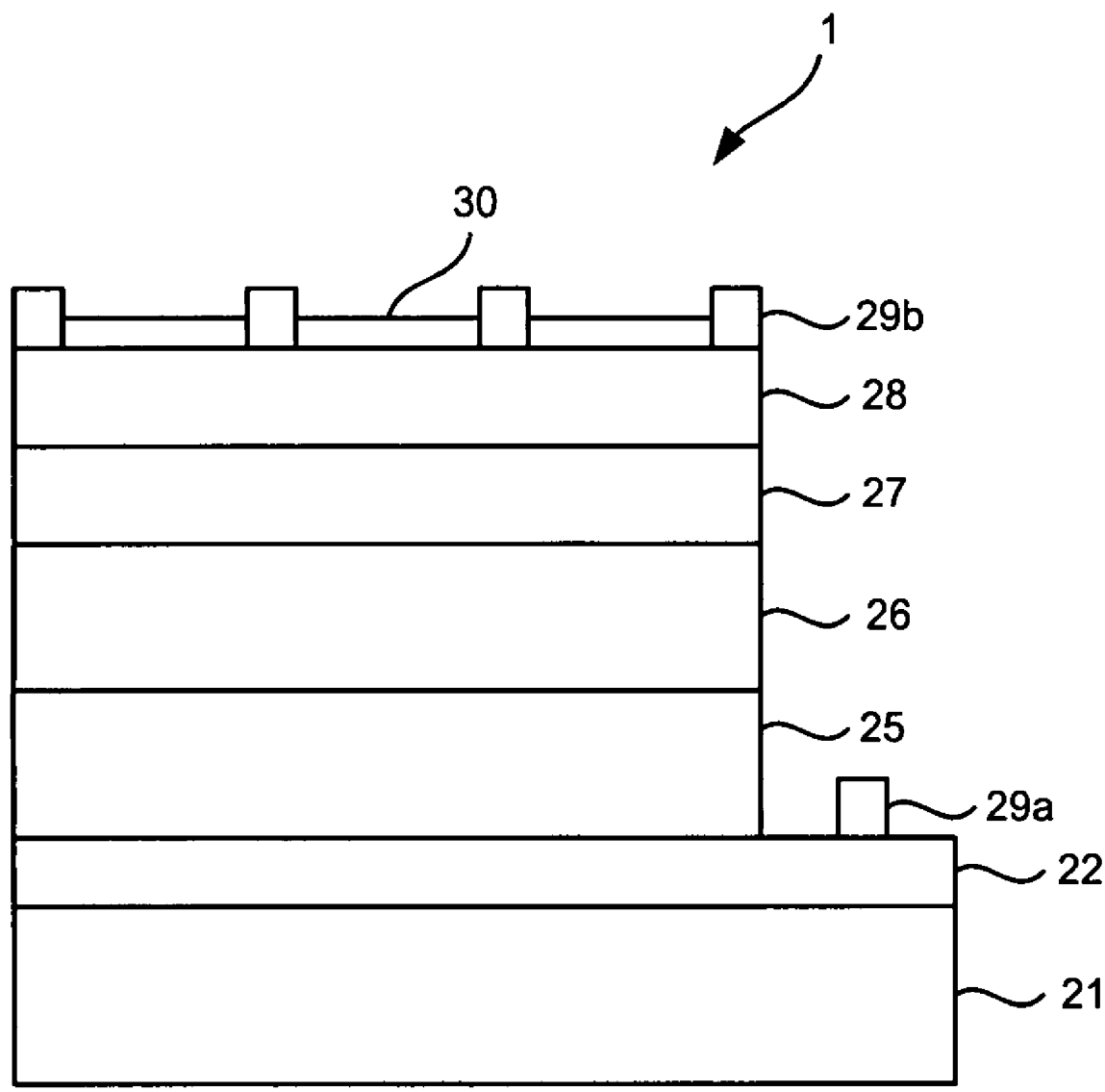
FIG. 6 is a side view of the thin-film poly-crystalline silicon solar cell made according to the method shown in FIG. 1.
Figure 7:
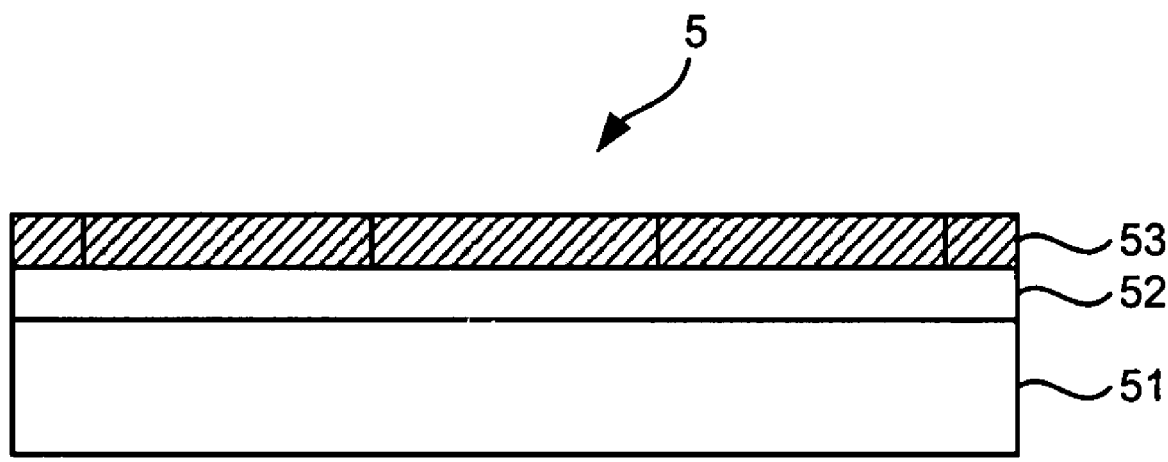
FIG. 7 is a side view of a conventional thin-film poly-crystalline silicon solar cell.

Referring to FIGS. 1 and 6, at 15, an ohmic contact 29a is made on the transparent and conductive ITO film 22, and other ohmic contacts 29$b$ on the $n^+$ poly-crystalline silicon film 28. An anti-reflection film 30 is coated on the $n^+$ poly-crystalline silicon film 28. Thus, the thin-film poly-crystalline silicon solar cell is made.

According to the present invention, the laminate including the Aluminum film 24 and the amorphous silicon film 23 is annealed at a temperature lower than the melting point of the glass substrate 21 so that the Aluminum film 24 is converted into the aluminum-silicon alloy film 25 and that the amorphous silicon film 23 is converted into the $p^+$ poly-crystalline silicon film 26 through the downward migration of aluminum from the Aluminum film 24 into the amorphous silicon film 23.

The $p^-$ poly-crystalline silicon film 27 is coated on the $p^+$ poly-crystalline silicon film 26, and the $n^+$ poly-crystalline silicon film 28 is coated on the $p^-$ poly-crystalline silicon film 27. Thus, the thin-film poly-crystalline silicon solar cell is made with a high transparency so that visible light can penetrate deeply into it. The thin-film poly-crystalline silicon solar cell is made with a low resistance. Moreover, the glass substrate 21 is inexpensive and can be made with a large area and an excellent semi-conductor property. The amorphous silicon film 23 is converted into the $p^+$ poly-crystalline silicon film 26 at the low-temperature process. Thus, the internal quantum efficiency and workability of the thin-film poly-crystalline silicon solar cell are high.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making a thin-film poly-crystalline silicon solar cell comprising the steps of:
    providing an ITO-glass substrate by coating a glass substrate with a transparent and conductive ITO film;
    growing an amorphous silicon film on the ITO-glass substrate;
    growing an aluminum film on the amorphous silicon film;
    annealing and therefore converting the aluminum film and the amorphous silicon film into an aluminum-silicon alloy film and a $p^+$ poly-crystalline silicon film, respectively, through the downward migration of aluminum from the aluminum film into the amorphous silicon film;
    coating a $p^-$ poly-crystalline silicon film on the $p^+$ poly-crystalline silicon film and an $n^+$ poly-crystalline silicon film on the $p^-$ poly-crystalline silicon film in a low-temperature plasma-based deposition process;
    providing an ohmic contact on the transparent and conductive ITO film and providing ohmic contacts on the $n^+$ poly-crystalline silicon film; and
    coating an anti-reflection film on the $n^+$ poly-crystalline silicon film.

2. The method according to claim 1, wherein the aluminum film and the amorphous silicon film are annealed at a temperature lower than the melting point of the glass substrate.

3. The method according to claim 1, wherein the low-temperature plasma-based deposition process is a plasma-enhanced chemical vapor deposition process.

* * * * *